(12) United States Patent
Yoshioka et al.

(10) Patent No.: US 9,165,922 B2
(45) Date of Patent: Oct. 20, 2015

(54) SEMICONDUCTOR DEVICE

(71) Applicant: KABUSHIKI KAISHA TOSHIBA, Tokyo (JP)

(72) Inventors: Akira Yoshioka, Kanagawa (JP); Yasunobu Saito, Tokyo (JP); Hidetoshi Fujimoto, Kanagawa (JP); Takeshi Uchihara, Saitama (JP); Naoko Yanase, Tokyo (JP); Toshiyuki Naka, Kanagawa (JP); Tetsuya Ohno, Kanagawa (JP); Tasuku Ono, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/015,986

(22) Filed: Aug. 30, 2013

(65) Prior Publication Data

US 2014/0284610 A1    Sep. 25, 2014

(30) Foreign Application Priority Data

Mar. 22, 2013 (JP) .................................. 2013-059343

(51) Int. Cl.
*H01L 27/06* (2006.01)
*H01L 27/095* (2006.01)

(52) U.S. Cl.
CPC .......... *H01L 27/0629* (2013.01); *H01L 27/095* (2013.01); *H01L 2224/48091* (2013.01); *H01L 2224/48137* (2013.01); *H01L 2224/73265* (2013.01); *H01L 2924/12032* (2013.01)

(58) Field of Classification Search
CPC ............ H01L 21/0435; H01L 27/0766; H01L 29/0619; H01L 27/095; H01L 29/0891; H01L 29/66143; H01L 29/66174

USPC ........................................................... 257/471
See application file for complete search history.

(56) References Cited

U.S. PATENT DOCUMENTS

| 4,583,107 A | * | 4/1986 | Clarke ........................ 257/281 |
| 6,552,390 B2 | | 4/2003 | Kameda |
| 7,157,748 B2 | * | 1/2007 | Saito et al. .................... 257/192 |
| 2007/0257708 A1 | * | 11/2007 | Shimokawa et al. ............. 327/5 |
| 2008/0003731 A1 | * | 1/2008 | Mazzola et al. .............. 438/192 |

(Continued)

FOREIGN PATENT DOCUMENTS

| JP | 200307843 A | 1/2003 |
| JP | 2008522447 A | 6/2008 |

(Continued)

OTHER PUBLICATIONS

Japanese Office Action dated Jun. 9, 2015, filed in Japanese No. 2013-059343, 11 pages (with translation).

*Primary Examiner* — Elias M Ullah
(74) *Attorney, Agent, or Firm* — Patterson & Sheridan, LLP

(57) ABSTRACT

According to an embodiment, a semiconductor device includes a conductive substrate, a Schottky barrier diode, and a field-effect transistor. The Schottky barrier diode is mounted on the conductive substrate and includes an anode electrode and a cathode electrode. The anode electrode is electrically connected to the conductive substrate. The field-effect transistor is mounted on the conductive substrate and includes a source electrode, a drain electrode, and a gate electrode. The source electrode of the field-effect transistor is electrically connected to the cathode electrode of the Schottky barrier diode. The gate electrode of the field-effect transistor is electrically connected to the anode electrode of the Schottky barrier diode.

14 Claims, 4 Drawing Sheets

(56) References Cited

U.S. PATENT DOCUMENTS

| | | | |
|---|---|---|---|
| 2008/0023696 A1* | 1/2008 | Yukawa et al. | 257/40 |
| 2008/0023825 A1 | 1/2008 | Hebert et al. | |
| 2009/0189191 A1* | 7/2009 | Sato et al. | 257/195 |
| 2011/0233758 A1 | 9/2011 | Machida et al. | |
| 2012/0228634 A1 | 9/2012 | Sugi et al. | |

FOREIGN PATENT DOCUMENTS

| | | |
|---|---|---|
| JP | 2008-198735 | 8/2008 |
| JP | 2009182107 A | 8/2009 |
| JP | 2011205020 A | 10/2011 |
| JP | 2012517699 A | 8/2012 |
| JP | 2012186353 A | 9/2012 |

* cited by examiner

SEMICONDUCTOR DEVICE

CROSS-REFERENCE TO RELATED APPLICATION

This application is based upon and claims the benefit of priority from Japanese Patent Application No. 2013-059343, filed on Mar. 22, 2013, the entire contents of which are incorporated herein by reference.

FIELD

Embodiments described herein relate generally to semiconductor devices including a Schottky barrier diode.

BACKGROUND

Silicon Schottky barrier diodes have the excellent properties that the on-voltage is low and the reverse recovery current is small. Thus they are widely used as power semiconductor devices.

It is desired that power semiconductor devices used in switching circuits or the like have stable rectification properties to ensure stable circuit operation.

DETAILED DESCRIPTION

In general, according to an embodiment, a semiconductor device includes a conductive substrate, a Schottky barrier diode, and a field-effect transistor. The Schottky barrier diode is mounted on the conductive substrate and includes an anode electrode and a cathode electrode. The anode electrode is electrically connected to the conductive substrate. The field-effect transistor is mounted on the conductive substrate and includes a source electrode, a drain electrode, and a gate electrode. The source electrode of the field-effect transistor is electrically connected to the cathode electrode of the Schottky barrier diode. The gate electrode of the field-effect transistor is electrically connected to the anode electrode of the Schottky barrier diode.

First Embodiment

Figure 1:
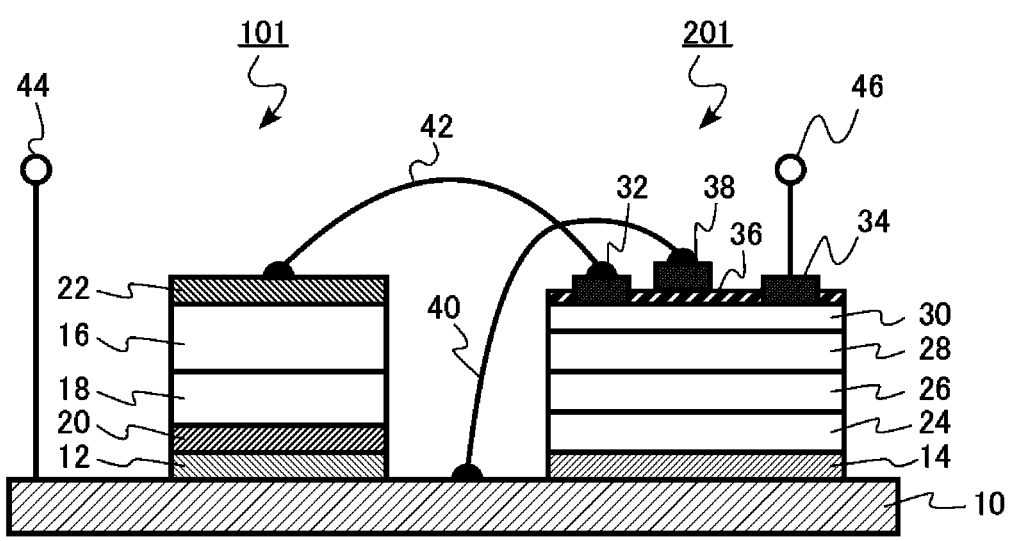
FIG. 1 is a schematic cross-sectional view depicting the configuration of a semiconductor device according to a first embodiment.

FIG. 1 is a schematic cross-sectional view depicting the configuration of a semiconductor device according to a first embodiment. The semiconductor device in this embodiment is a compound-type device in which a Schottky barrier diode 101 and a field-effect transistor 201 are mounted on the same conductive substrate 10.

The conductive substrate 10 is, for example, a copper (Cu) plate. The conductive substrate 10 is not limited to copper, and may be, for example, a metal plate with high conductivity, such as aluminum. Also, the conductive substrate 10 is not necessarily a metal plate, and may be, for example, a plate formed by affixing a conductive foil such as a copper foil to an otherwise insulating plate, for example a plate made of a resin used for mounting a plurality of semiconductor devices.

The Schottky barrier diode 101 is mounted on the conductive substrate 10 using a first adhesion layer 12. The field-effect transistor 201 is mounted on the conductive substrate 10 using a second adhesion layer 14.

The first adhesion layer 12 and the second adhesion layer 14 are conductive materials such as solder or conductive resin paste.

The Schottky barrier diode 101 has a laminated structure including an n-type semiconductor substrate 16 and a semiconductor layer 18 having resistance higher than that of the n-type semiconductor substrate 16. An anode electrode (positive electrode) 20 is provided on a surface of the semiconductor layer 18 such that semiconductor layer 18 is between anode electrode 20 and the n-type semiconductor substrate 16, and a cathode electrode (negative electrode) 22 on a surface of the n-type semiconductor substrate 16 such that n-type semiconductor layer 16 is between cathode electrode 22 and the semiconductor layer 18.

The semiconductor layer 18 and the anode electrode 20 form a Schottky junction. The semiconductor substrate 16 and the cathode electrode 22 form an ohmic junction.

The semiconductor substrate 16 and the semiconductor layer 18 are formed from the same semiconductor material. The semiconductor material is, for example, silicon. A Schottky barrier diode formed from silicon is relatively inexpensive, and has excellent properties for many applications in that the on-voltage is low and the reverse recovery current is small. Other than silicon, semiconductor materials such as silicon carbide (SiC), for example, can be used.

The material of the anode electrode 20 is not limited to a particular one as long as the material forms a Schottky junction with the semiconductor layer 18. For example, materials such as tungsten (W) and molybdenum (Mo) can be used. The material of the cathode electrode 22 is also not limited to a particular one as long as the material forms an ohmic junction with the semiconductor substrate 16. For example, metals such as aluminum (Al) and titanium (Ti) can be used.

The Schottky barrier diode 101 is mounted on the conductive substrate 10 using the first adhesion layer 12 such that that the anode electrode (positive electrode) 20 is in contact with the first adhesion layer 12 and opposite to the conductive substrate 10.

The field-effect transistor 201 is, for example, a normally-on type high-electron-mobility transistor (HEMT) formed from nitride semiconductor. The field-effect transistor 201 has a laminated structure with a substrate 24, a buffer layer 26 on the substrate 24, a first nitride semiconductor layer 28 on the buffer layer 26, and a second nitride semiconductor layer 30 on the first nitride semiconductor layer 28.

A source electrode 32 and a drain electrode 34 are formed on a surface of the second nitride semiconductor layer 30. An ohmic junction is formed between the source electrode 32 and the second nitride semiconductor layer 30 and between the drain electrode 34 and the second nitride semiconductor layer 30.

A gate electrode 38 is formed between the source electrode 32 and the drain electrode 34 with a gate insulating film 36 interposed between the gate electrode 38 and the second nitride semiconductor layer 30. Alternatively, the gate insulating film 36 may not be included, thus forming a Schottky junction between the gate electrode 38 and the second nitride semiconductor layer 30.

The substrate (transistor substrate) 24 is conductive, and, for example, silicon, silicon carbide or the like can be used therefor. The buffer layer 26 is a layer for mediating the difference in lattice constants between the substrate 24 and the first and second nitride semiconductor layers 28 and 30. The buffer layer 26 commonly comprises a plurality of nitride semiconductor layers of different materials.

The materials of the first nitride semiconductor layer 28 and the second nitride semiconductor layer 30 are chosen so that a two-dimensional electron gas is generated at the interface therebetween. For example, gallium nitride (GaN) can be chosen for the first nitride semiconductor layer 28, and aluminum gallium nitride (AlGaN) for the second nitride semiconductor layer 30.

The material of the source electrode 32 and the drain electrode 34 is not limited to a particular one as long as it is a material that forms ohmic junctions with the second nitride semiconductor layer 30. An example of the material is aluminum (Al), titanium (Ti), or nickel (Ni). The material may be an alloy or a laminated structure of these metals. Additionally, the source electrode 32 and the drain electrode 34 may be laminated at the top (coated) with a layer of low-resistance metal such as gold (Au) to reduce resistance.

For the material of the gate insulating film 36, for example, silicon nitride (SiNx) or silicon oxide ($SiO_2$) can be used. The material of the gate electrode 38 is also not limited to a particular one. For example, the material may be nickel (Ni), titanium (Ti), or platinum (Pt). Alternatively, the material may be an alloy or a laminated structure of these metals. Additionally, the gate electrode 38 may be laminated at the top with a layer of low-resistance metal such as gold (Au) to reduce resistance.

The field-effect transistor 201 is mounted on the conductive substrate 10 using the second adhesion layer 14 such that the back surface of substrate 24 is in contact with adhesion layer 14 and is opposite to the conductive substrate 10.

The gate electrode 38 of the field-effect transistor 201 is connected to the conductive substrate 10 via a bonding wire 40. With this, the gate electrode 38 is electrically connected to the anode electrode 20 of the Schottky barrier diode 101 via the conductive substrate 10 and the conductive adhesion layer 12.

The source electrode 32 of the field-effect transistor 201 is electrically connected to the cathode electrode 22 of the Schottky barrier diode 101 via a bonding wire 42.

The conductive substrate 10 is connected to a first external terminal 44 via a bonding wire or the like not specifically depicted. The drain electrode 34 is connected to a second external terminal 46 via a bonding wire or the like not specifically depicted. The first and second external terminals are portions of the device used for making electrical connections to outside of the device.

Figure 2:
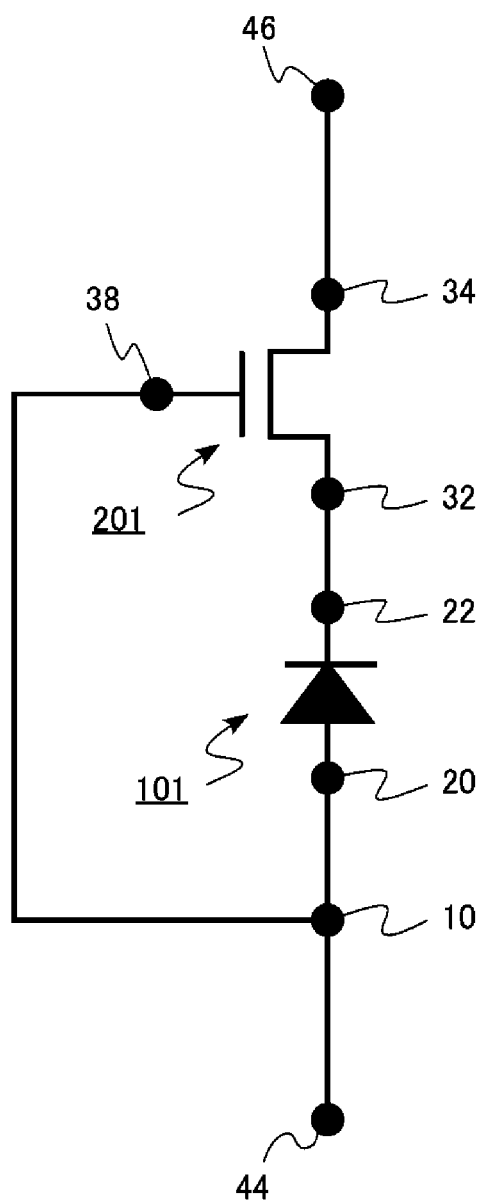
FIG. 2 is a circuit diagram of the semiconductor device according to the first embodiment.

FIG. 2 is a circuit diagram of the semiconductor device in this first embodiment. Hereinafter, with reference to FIGS. 1 and 2, the operation of the compound-type Schottky barrier diode in this embodiment will be described.

When the first external terminal 44 is grounded and a positive voltage is applied to the second external terminal 46, the field-effect transistor 201, which is a normally-on type, is turned to an on-state. On the other hand, the Schottky barrier diode 101 is turned to an off-state. As a result, the potential of the source electrode 32 and the cathode electrode 22 becomes a positive potential with respect to the potential of the gate electrode 38, the anode electrode 20, and the conductive substrate 10.

When the potential of the second external terminal 46 is increased to the threshold voltage of the field-effect transistor 201, the field-effect transistor 201 switches to an off-state due to a potential difference between the potential of the source electrode 32 and the cathode electrode 22 and the potential of the gate electrode 38, the anode electrode 20, and the conductive substrate 10.

When a voltage is further applied to the second external terminal 46, most of the applied voltage is applied to the field-effect transistor 201 because the field-effect transistor 201 is in the off-state. Accordingly, a voltage equal to or exceeding the threshold voltage is not applied to the Schottky barrier diode 101. Thus, effectively the withstand (breakdown) voltage of the compound-type Schottky barrier diode in this embodiment is determined by the withstand (breakdown) voltage of the field-effect transistor 201. Therefore, a compound-type Schottky barrier diode with a withstand voltage equal to or higher than that of the Schottky barrier diode 101 alone can be provided.

Next, when the second external terminal 46 is grounded and a positive voltage is applied to the first external terminal 44, the Schottky barrier diode 101 is turned to an on-state. A current flows through the normally-on type field-effect transistor 201, and the current reaches the second external terminal 46. Since the field-effect transistor 201 is the normally-on type, the on-voltage of the compound-type Schottky barrier diode in this embodiment is determined by the on-voltage of the Schottky barrier diode 101.

According to this embodiment, by using, for example, a low-on-voltage silicon Schottky barrier diode for the Schottky barrier diode 101 and using, for example, a high-withstand-voltage nitride semiconductor HEMT with a withstand voltage of 600 V or more for the field-effect transistor 201, a compound-type Schottky barrier diode capable of high-speed operation with a high withstand voltage and a low on-resistance can be provided.

In the compound-type Schottky barrier diode in this embodiment, the conductive substrate 10 is electrically connected to the first external terminal 44. Therefore, during operation of the compound-type Schottky barrier diode, the conductive substrate 10 with a large area and consequently with a large parasitic capacitance remains fixed to the potential of the first external terminal 44, thereby being prevented from being in a floating state. This allows for stable circuit operation and enhanced switching characteristics.

For example, suppose that, unlike in this embodiment, the Schottky barrier diode 101 is mounted upside down, and the cathode electrode 22 is connected to the conductive substrate 10. Then, during operation of the compound-type Schottky barrier diode in an off-state, the potential of the conductive substrate 10 is floating and can vary greatly. This causes the circuit operation to become unstable and the switching characteristics to deteriorate.

In this embodiment, the conductive substrate 10 is electrically connected to the first external terminal 44, so that the above-described problems are avoided, and a semiconductor device with stable rectification properties is provided.

Second Embodiment

A semiconductor device according to a second embodiment includes a field-effect transistor mounted on a conductive substrate via an insulator. The explanation of those portions of the second embodiment which are similar to the first embodiment will not be repeated.

Figure 3:
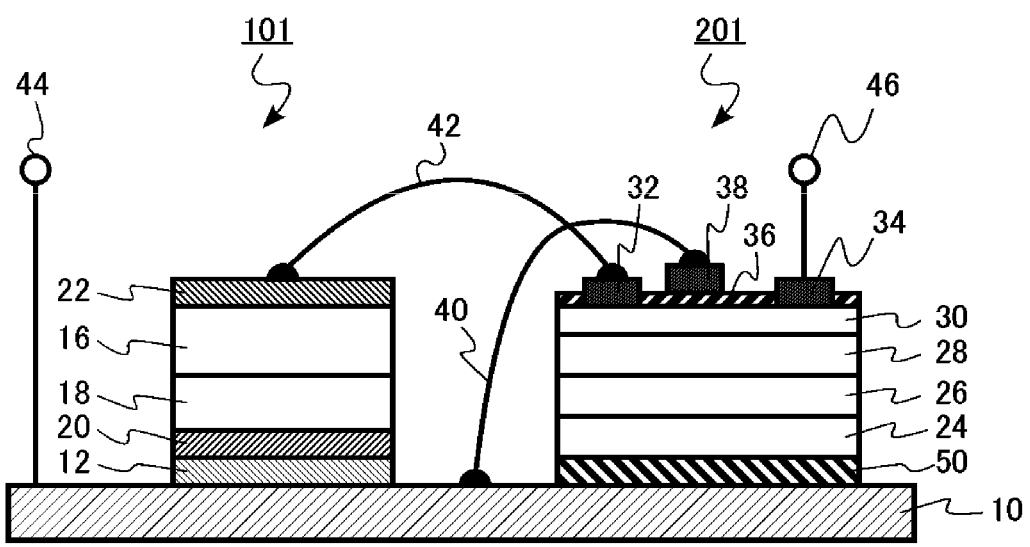
FIG. 3 is a schematic cross-sectional view depicting the configuration of a semiconductor device according to a second embodiment.

FIG. 3 is a schematic cross-sectional view depicting the configuration of the semiconductor device in the second embodiment.

As shown in FIG. 3, in the semiconductor device in this embodiment, a field-effect transistor 201 is mounted on a conductive substrate 10 using a third adhesion layer 50 (rather than a second adhesion layer 14). The third adhesion layer 50 is an insulator. For example, an insulating resin paste can be used as the third adhesion layer 50.

The switching characteristics of a compound-type Schottky barrier diode in this embodiment depend on the gate capacitance of the field-effect transistor 201. In this embodiment, of the gate capacitance, the capacitance between a gate electrode 38 and the conductive substrate 10 is reduced by mounting the field-effect transistor 201 via the insulator (third adhesion layer 50). This results in a compound-type Schottky barrier diode with further enhanced switching characteristics and stable rectification properties.

Third Embodiment

A semiconductor device according to a third embodiment includes a field-effect transistor formed using a high-resistance substrate with a resistivity of 100 Ωcm or more. The explanation of those portions of the third embodiment which are similar to the first embodiment will not be repeated.

Figure 4:
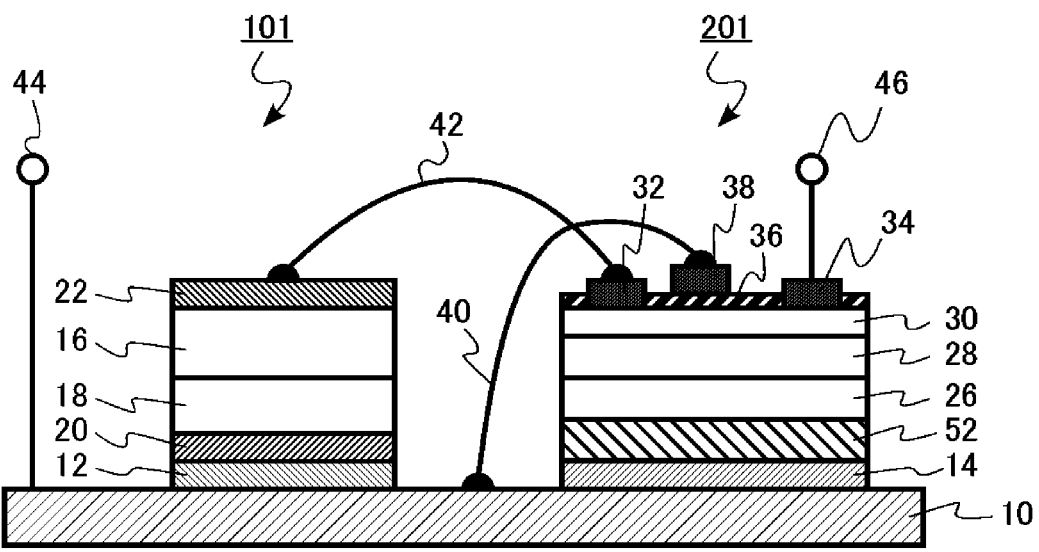
FIG. 4 is a schematic cross-sectional view depicting the configuration of a semiconductor device according to a third embodiment.

FIG. 4 is a schematic cross-sectional view depicting the configuration of the semiconductor device in the third embodiment.

As shown in FIG. 4, in the semiconductor device in this embodiment, a field-effect transistor 201 is formed using a high-resistance substrate 52 (rather than substrate 24) with a resistivity of 100 Ωcm or more. Specifically, the field-effect transistor 201 has a laminated structure with the high-resistance substrate (transistor substrate) 52, a buffer layer 26 on the high-resistance substrate 52, a first nitride semiconductor layer 28 on the buffer layer 26, and a second nitride semiconductor layer 30 on the first nitride semiconductor layer 28.

The high-resistance substrate 52 is, for example, a high-resistance silicon substrate, a sapphire substrate, or the like. The resistivity of a substrate can be determined by the material of the substrate and the amount of conductive impurities included in the material.

The switching characteristics of a compound-type Schottky barrier diode in this embodiment depend on the gate capacitance of the field-effect transistor 201. In this embodiment, the capacitance (gate capacitance) between the gate electrode 38 and the conductive substrate 10 is reduced by making the substrate of the field-effect transistor 201 (e.g., substrate 52) highly resistive. Consequently, a compound-type Schottky barrier diode with further enhanced switching characteristics and stable rectification properties can be provided.

Fourth Embodiment

Figure 5:
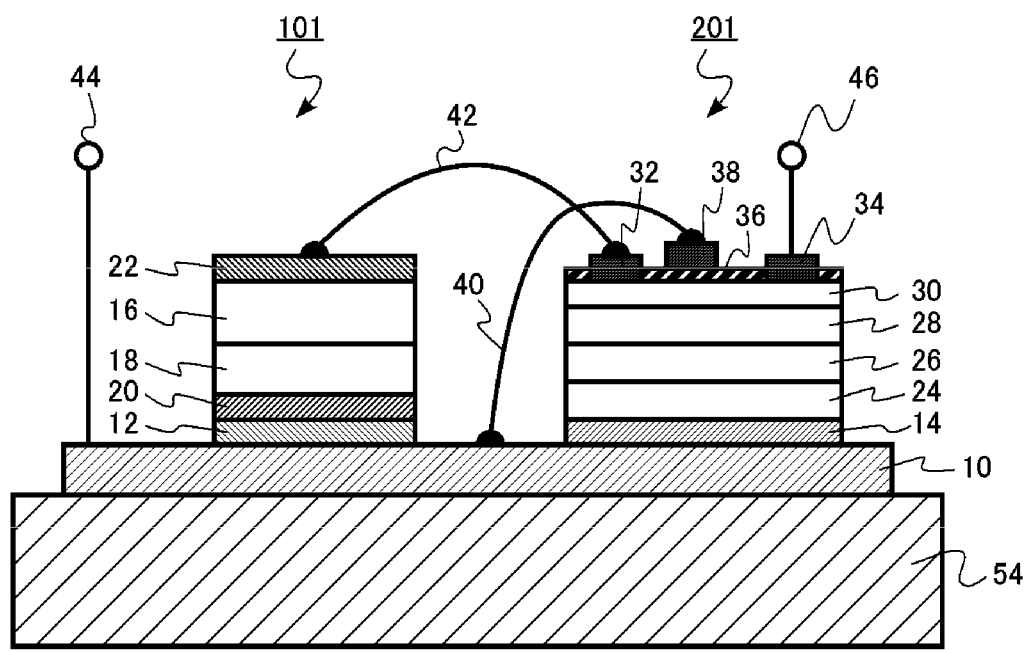
FIG. 5 is a schematic cross-sectional view depicting the configuration of a semiconductor device according to a fourth embodiment.

A semiconductor device according to a fourth embodiment includes a metal heatsink provided on a back side of the conductive substrate 10. The explanation of those portions of the fourth embodiment which are similar to the first embodiment will not be repeated. FIG. 5 is a schematic cross-sectional view showing the configuration of a semiconductor device according to this embodiment.

As shown in FIG. 5, in the semiconductor device in this embodiment, a metal heatsink 54 is provided on the back side of the conductive substrate 10 and in contact with the conductive substrate 10.

In the fourth embodiment, the conductive substrate 10 is connected to a first external terminal 44. This enables the provision of a large-volume heatsink 54 in connection with the conductive substrate 10, with limited effect on the circuit operation.

According to the fourth embodiment, a compound-type Schottky barrier diode with excellent heatsinking can be provided.

Although the above embodiments have been described with a HEMT as an example of a semiconductor device, a field-effect transistor other than a HEMT can be used.

While certain embodiments have been described, these embodiments have been presented by way of example only, and are not intended to limit the scope of the disclosure. Indeed, the embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a conductive substrate;
   a field-effect transistor mounted on the conductive substrate, the field-effect transistor including:
      a transistor substrate;
      a buffer layer disposed on the substrate;
      a first semiconductor layer disposed on the buffer layer;
      a second semiconductor layer disposed on the first semiconductor layer;
      a source electrode disposed on the second semiconductor layer;
      a drain electrode disposed on the second semiconductor layer, spaced apart from the source electrode; and
      a gate electrode disposed between the source electrode and the drain electrode, and spaced apart from the source electrode and the drain electrode; and
   a Schottky barrier diode mounted on the conductive substrate, the Schottky barrier diode including:
      an anode electrode electrically connected to the conductive substrate;
      a n-type semiconductor substrate disposed on the anode electrode;
      a third semiconductor layer disposed on the n-type semiconductor substrate and having a resistance that is higher than a resistance of the n-type semiconductor substrate; and
      a cathode electrode disposed on the third semiconductor layer;
   wherein the source electrode is electrically connected to the cathode electrode and the gate electrode is electrically connected to the anode electrode.

2. The semiconductor device of claim 1, wherein the transistor substrate has a resistivity greater than or equal to 100 Ωcm.

3. The semiconductor device of claim 1, further comprising a heatsink connected to the conductive substrate.

4. The semiconductor device of claim 1, wherein the conductive substrate comprises a conductive foil on an insulating material.

5. The semiconductor device of claim 1, wherein the source electrode is electrically connected to the cathode with a first bonding wire, and the gate electrode is electrically connected to the anode electrode with a second bonding wire.

6. The semiconductor device of claim 1, wherein the Schottky barrier diode is mounted on the conductive substrate using a conductive resin paste, and the field effect transistor is mounted on the conductive substrate using an insulating resin paste.

7. The semiconductor device of claim 1, wherein the n-type semiconductor substrate and the third semiconductor layer comprise silicon.

8. The semiconductor device of claim 1, further comprising:
a first external terminal electrically connected to the conductive substrate; and
a second external terminal electrically connected to the drain electrode.

9. The semiconductor device of claim 1, wherein the field-effect transistor is a high-electron mobility transistor.

10. The semiconductor device of claim 1, further comprising a gate insulating layer between the gate electrode and the second semiconductor layer.

11. A power semiconductor device, comprising:
a conductive substrate;
a field-effect transistor mounted on the conductive substrate, the field-effect transistor including:
a transistor substrate;
a buffer layer disposed on the substrate;
a first semiconductor layer disposed on the buffer layer, the first semiconductor layer comprising a first nitride semiconductor material;
a second semiconductor layer disposed on the first semiconductor layer, the second semiconductor layer comprising a second nitride semiconductor material;
a source electrode disposed on the second semiconductor layer;
a drain electrode disposed on the second semiconductor layer, spaced apart from the source electrode; and
a gate electrode disposed between the source electrode and the drain electrode, and spaced apart from the source electrode and the drain electrode; and
a Schottky barrier diode mounted on the conductive substrate, the Schottky barrier diode including:
an anode electrode electrically connected to the conductive substrate;
a n-type semiconductor substrate disposed on the anode electrode;
a third semiconductor layer disposed on the n-type semiconductor substrate and having a resistance that is higher than a resistance of the n-type semiconductor substrate; and
a cathode electrode disposed on the third semiconductor layer;
wherein the source electrode is electrically connected to the cathode electrode, the gate electrode is electrically connected to the anode electrode, the conductive substrate is electrically connected to a first external terminal, and the drain electrode is electrically connected to a second external terminal.

12. The power semiconductor device of claim 11, wherein the first nitride semiconductor material is gallium nitride and the second nitride semiconductor material is aluminum gallium nitride.

13. The power semiconductor device of claim 11, wherein the transistor substrate is conductive.

14. The power semiconductor device of claim 11, further comprising a gate insulating layer between the gate electrode and the second semiconductor layer.

* * * * *